(12) United States Patent
Lai et al.

(10) Patent No.: US 10,084,389 B2
(45) Date of Patent: Sep. 25, 2018

(54) POWER MODULE

(71) Applicant: Delta Electronics Int'l (Singapore) Pte Ltd, Singapore (SG)

(72) Inventors: Yiu-Wai Lai, Singapore (SG); Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 30 days.

(21) Appl. No.: 15/165,779

(22) Filed: May 26, 2016

(65) Prior Publication Data

US 2016/0351478 A1 Dec. 1, 2016

(30) Foreign Application Priority Data

May 29, 2015 (SG) .............................. 10201504273U

(51) Int. Cl.

| | |
|---|---|
| *H02M 7/06* | (2006.01) |
| *H01L 29/739* | (2006.01) |
| *H01L 29/861* | (2006.01) |
| *H01L 23/31* | (2006.01) |
| *H01L 23/538* | (2006.01) |

(Continued)

(52) U.S. Cl.
CPC ........... *H02M 7/06* (2013.01); *H01L 23/3114* (2013.01); *H01L 23/5384* (2013.01); *H01L 23/5389* (2013.01); *H01L 24/18* (2013.01); *H01L 25/112* (2013.01); *H01L 25/18* (2013.01); *H01L 29/7395* (2013.01); *H01L 29/861* (2013.01); *H01L 23/3735* (2013.01); *H01L 23/49861* (2013.01); *H02M 7/003* (2013.01); *H02M 7/5387* (2013.01)

(58) Field of Classification Search
None
See application file for complete search history.

(56) References Cited

U.S. PATENT DOCUMENTS

2006/0261472 A1* 11/2006 Kimura ............... H01L 25/0657
257/724
2011/0108971 A1* 5/2011 Ewe ........................ H01L 21/56
257/686

(Continued)

*Primary Examiner* — Tom Thomas
*Assistant Examiner* — Steven B Gauthier
(74) *Attorney, Agent, or Firm* — Kirton McConkie; Evan R. Witt

(57) ABSTRACT

A power module includes a substrate, a first sub-module and a second sub-module. Each of the first sub-module and the second sub-module includes a semiconductor switch and a diode. The first sub-module is formed as the high-voltage-side switching element. The second sub-module is formed as the low-voltage-side switching element. The plural electrodes of the high-voltage-side switching element and the plural electrodes of the low-voltage-side switching element are electrically connected with the conducting terminals of the corresponding semiconductor switches and the corresponding diodes. The high-voltage-side switching element is disposed on the substrate and electrically connected with the corresponding conducting parts of the substrate. The low-voltage-side switching element is disposed on the high-voltage-side switching element and electrically connected with the corresponding conducting parts of the substrate through the high-voltage-side switching element.

14 Claims, 5 Drawing Sheets

(51) Int. Cl.
  H01L 23/00    (2006.01)
  H01L 25/11    (2006.01)
  H01L 25/18    (2006.01)
  *H02M 7/00*      (2006.01)
  *H01L 23/373*    (2006.01)
  *H01L 23/498*    (2006.01)
  *H02M 7/5387*    (2007.01)

(56)         References Cited

U.S. PATENT DOCUMENTS

2012/0235162 A1\*  9/2012  Isobe .................... H01L 23/467
                                              257/77
2013/0221526 A1\*  8/2013  Lange .................... H01L 21/50
                                              257/750
2014/0110863 A1\*  4/2014  Cho ..................... H01L 23/5226
                                              257/777

\* cited by examiner

POWER MODULE

FIELD OF THE INVENTION

The present invention relates to a power module, and more particularly to a power module for a power converter.

BACKGROUND OF THE INVENTION

Recently, the general trends in designing power converters are toward high efficiency and high density. The high efficiency power converter can reduce the power loss and achieve the power-saving purpose. The high density power converter can reduce the overall volume of the electronic product and meet the requirements of small size and light weightiness.

Generally, a power converter comprises a bridge circuit for rectification. The bridge circuit comprises at least one high-voltage-side switching element and at least one low-voltage-side switching element. For example, a three-phase bridge circuit of a three-phase power converter comprises three high-voltage-side switching elements and three low-voltage-side switching elements. The high-voltage-side switching elements are connected with the corresponding low-voltage-side switching elements in series. Each of the high-voltage-side switching elements and the low-voltage-side switching elements comprises a semiconductor switch and a diode, which are connected with each other in parallel. For example, the semiconductor switch is an insulated-gate bipolar transistor (IGBT). By alternately turning on and turning off the semiconductor switch, the bridge circuit can rectify the input power. When the semiconductor switch is turned off, the diode allows the current to continuously flow.

A conventional method of fabricating the bridge circuit of the power converter will be illustrated as follows. Firstly, the semiconductor switches and the diodes of the high-voltage-side switching elements and the semiconductor switches and the diodes of the low-voltage-side switching elements are disposed on a substrate. Then, the semiconductor switches and the diodes of the high-voltage-side switching elements and the semiconductor switches and the diodes of the low-voltage-side switching elements are connected with each other and/or connected with an external component by a wire-bonded technology (e.g. through aluminum wires or copper wires). Afterwards, the above structure is packaged by an encapsulation material.

However, since the high-voltage-side switching elements and the low-voltage-side switching elements are connected with each other by the wire-bonded technology, some drawbacks occur. For example, the long wires for connecting the high-voltage-side switching elements and the low-voltage-side switching elements may increase the parasitic inductance between the wires and the substrate. Under this circumstance, the switching efficiency of the high-voltage-side switching elements and the low-voltage-side switching elements will be adversely affected. Moreover, since the long wire has a large impedance value, the power conversion efficiency is impaired. Moreover, the side of the substrate for wire-bonding the high-voltage-side switching elements and the low-voltage-side switching elements cannot be equipped with any heat dissipation device. Since the substrate is only able to dissipate away heat in a single direction, the heat dissipating efficiency is insufficient. Moreover, since it is necessary to retain a wire-bonded area on the substrate, the space utilization of the substrate is limited. Under this circumstance, it is difficult to increase the power density. Moreover, the high-voltage-side switching elements and the low-voltage-side switching elements of the bridge circuit are packaged after being mounted on the substrate. After the bridge circuit is fabricated, if one component of the high-voltage-side switching element or the low-voltage-side switching element has malfunction, the damaged component cannot be replaced with a new one. Under this circumstance, the whole bridge circuit cannot be used again.

Therefore, there is a need of providing an improved power module so as to overcome the above drawbacks.

SUMMARY OF THE INVENTION

An object of the present invention provides a power module with semiconductor switches and diodes embedded within insulation layers. Consequently, a first sub-module and a second sub-module are formed as a high-voltage-side switching element and a low-voltage-side switching element of a bridge circuit. The high-voltage-side switching element and the low-voltage-side switching element are disposed on a substrate and electrically connected with corresponding conducting parts of the substrate. Consequently the power module of the present invention has reduced parasitic inductance, increased switching efficiency, reduced impedance and increased power conversion efficiency. Moreover, since it is not necessary to retain a wire-bonded area on the substrate, the space utilization of the substrate is increased. Under this circumstance, the power density is enhanced.

In accordance with an aspect of the present invention, there is provided a power module. The power module includes a substrate, at least one first sub-module and at least one second sub-module. The substrate includes plural first conducting parts, plural second conducting parts and at least one third conducting part. The at least one first sub-module is disposed on the substrate. The first sub-module includes a first semiconductor switch, a first diode, a first electrode, a second electrode, a third electrode, a fourth electrode, an upper fifth electrode, a lower fifth electrode, an upper sixth electrodes and a lower sixth electrode. The upper fifth electrode and the lower fifth electrode are electrically connected with each other. The upper sixth electrodes and the lower sixth electrode are electrically connected with each other. The first electrode, the upper fifth electrode and the upper sixth electrode are located at a top side of the first sub-module. The second electrode, the third electrode, the fourth electrode, the lower fifth electrode and the lower sixth electrode are located at a bottom side of the first sub-module. The first semiconductor switch includes plural first conducting terminals. The first diode includes plural second conducting terminals. The first electrode and the third electrode are electrically connected with the corresponding first conducting terminals of the first semiconductor switch and electrically connected with the corresponding second conducting terminals of the first diode. The first electrode is electrically connected with the fourth electrode. The second electrode is electrically connected with the corresponding first conducting terminal of the first semiconductor switch. The second electrode and the lower fifth electrode are electrically connected with the corresponding first conducting parts. The fourth electrode and the lower sixth electrode are electrically connected with the corresponding second conducting parts. The third electrode is electrically connected with the third conducting part. The at least one second sub-module is disposed on the first sub-module. The second sub-module includes a second semiconductor switch, a second diode, a seventh electrode, an eighth electrode and a ninth electrode. The second semiconductor switch includes plural third conducting terminals. The second diode includes plural fourth conducting terminals. The seventh electrode is electrically connected with the corresponding third conducting terminal of the second semiconductor switch and the corresponding fourth conducting terminal of the second diode. The eighth electrode is electrically connected with the corresponding third conducting terminal of the second semiconductor switch. The ninth electrode is electrically connected with the corresponding third conducting terminal of the second semiconductor switch and the corresponding fourth conducting terminal of the second diode. The seventh electrode is electrically connected with the upper sixth electrode of the first sub-module. The eighth electrode is electrically connected with the upper lower fifth electrode of the first sub-module. The ninth electrode is electrically connected with the first electrode of the first sub-module.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
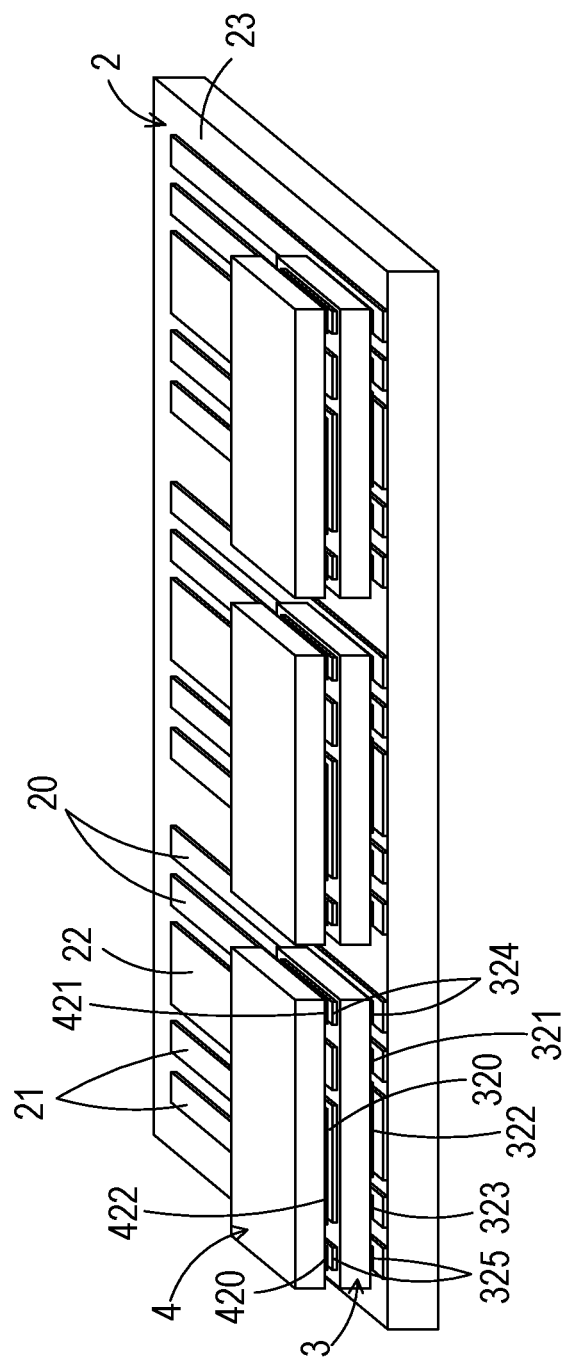
FIG. 1 is a schematic perspective view illustrating a power module according to an embodiment of the present invention.
Figure 2:
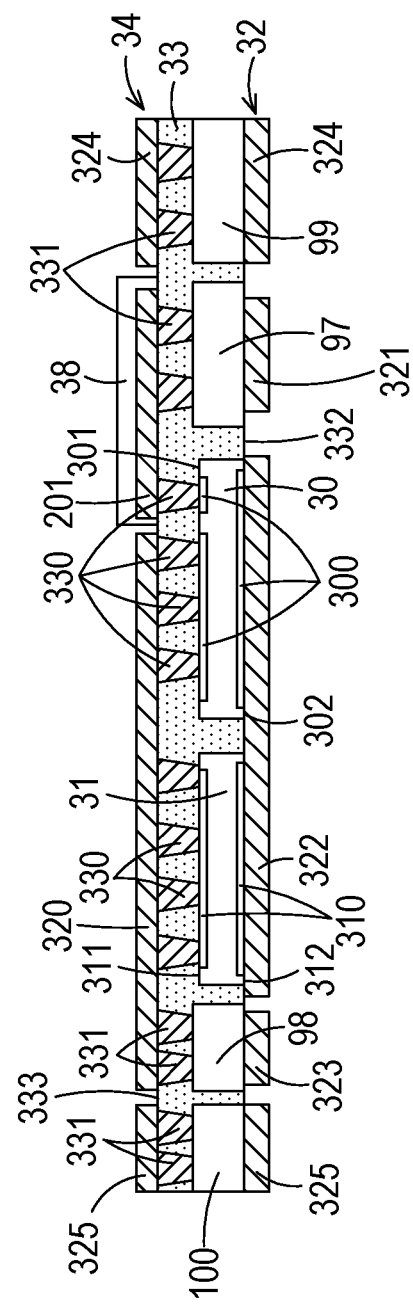
FIG. 2 is a schematic cross-sectional view illustrating a first sub-module of the power module of FIG. 1.
Figure 3:
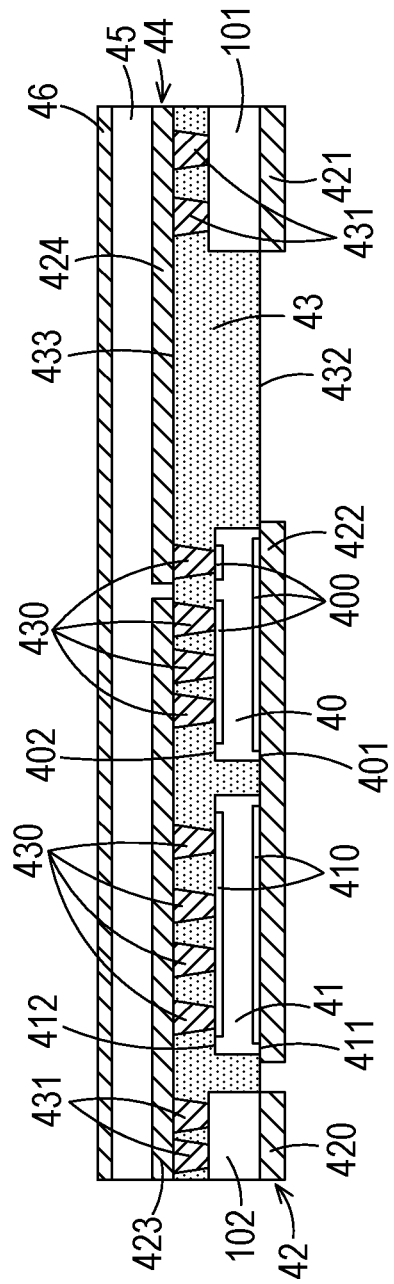
FIG. 3 is a schematic cross-sectional view illustrating a second sub-module of the power module of FIG. 1.

FIG. 1 is a schematic perspective view illustrating a power module according to an embodiment of the present invention. FIG. 2 is a schematic cross-sectional view illustrating a first sub-module of the power module of FIG. 1. FIG. 3 is a schematic cross-sectional view illustrating a second sub-module of the power module of FIG. 1. Please refer to FIGS. 1, 2 and 3. The power module 1 comprises a substrate 2, at least one first sub-module 3 and at least one second sub-module 4. Moreover, plural first conducting parts 20, plural second conducting parts 21 and at least one third conducting part 22 are formed on a first surface 23 of the substrate 2.

In this embodiment, two first conducting parts 20 are located at a right side of the third conducting part 22, and two second conducting parts 21 are located at left side of the third conducting part 22. Moreover, the first conducting parts 20, the second conducting parts 21 and the third conducting part 22 are made of electrically conductive material (e.g. copper).

The first sub-module 3 is disposed on the first surface 23 of the substrate 2. Moreover, the first sub-module 3 comprises a first semiconductor switch 30, a first diode 31, a first electrode 320, a second electrode 321, a third electrode 322, a fourth electrode 323, two fifth electrodes 324 and two sixth electrodes 325. The two fifth electrodes 324 are electrically connected with each other. The two sixth electrodes 325 are electrically connected with each other. The first semiconductor switch 30 comprises plural first conducting terminals 300. The first diode 31 comprises plural second conducting terminals 310. The first electrode 320, one of the fifth electrodes 324 (also referred as an upper fifth electrode) and one of the sixth electrodes 325 (also referred as an upper sixth electrode) are located at a top side of the first sub-module 3. The second electrode 321, the third electrode 322, the fourth electrode 323, the other fifth electrode 324 (also referred as a lower fifth electrode) and the other sixth electrode 325 (also referred as a lower sixth electrode) are located at a bottom side of the first sub-module 3. The first electrode 320 and the third electrode 322 are electrically connected with the corresponding first conducting terminals 300 of the first semiconductor switch 30. The first electrode 320 and the third electrode 322 are also electrically connected with the corresponding second conducting terminals 310 of the first diode 31. The first electrode 320 is also electrically connected with the fourth electrode 323. The second electrode 321 is electrically connected with the corresponding first conducting terminal 300 of the first semiconductor switch 30. When the first sub-module 3 is placed on the substrate 2, the second electrode 321 and the lower fifth electrode 325 are contacted with the corresponding first conducting parts 20, the fourth electrode 323 and the lower sixth electrode 325 are contacted with the corresponding second conducting parts 21, and the third electrode 322 is contacted with the third conducting part 22.

The third electrode 322 is arranged between the first electrode 320 and the fourth electrode 323. The second electrode 321 is arranged between the third electrode 322 and the lower fifth electrode 324. The fourth electrode 323 is arranged between the third electrode 322 and the lower sixth electrode 325.

Optionally, the first sub-module 3 further comprises an auxiliary electrode 201. The auxiliary electrode 201 is located at the top side of the first sub-module 3, and arranged between the first electrode 320 and the upper fifth electrode 324. Moreover, the auxiliary electrode 201 is electrically connected with the second electrode 321 and electrically connected with the corresponding first conducting terminal 300 of the first semiconductor switch 30.

An example of the first semiconductor switch 30 includes but is not limited to an insulated-gate bipolar transistor (IGBT). Consequently, the first semiconductor switch 30 comprises three first conducting terminals 300. The three first conducting terminals 300 serve as a gate, an emitter and a collector, respectively. The first electrode 320 is electrically connected with the collector. The second electrode 321 is electrically connected with the gate. The third electrode 322 is electrically connected with the emitter.

The second sub-module 4 is disposed on the first sub-module 3. Moreover, the second sub-module 4 comprises a second semiconductor switch 40, a second diode 41, a seventh electrode 420, an eighth electrode 421 and a ninth electrode 422. The second semiconductor switch 40 comprises plural third conducting terminals 400. The second diode 41 comprises plural fourth conducting terminals 410. The seventh electrode 420 is electrically connected with the corresponding third conducting terminal 400 of the second semiconductor switch 40 and the corresponding fourth conducting terminal 410 of the second diode 41. The eighth electrode 421 is electrically connected with the corresponding third conducting terminal 400 of the second semiconductor switch 40. The ninth electrode 422 is electrically connected with the corresponding third conducting terminal 400 of the second semiconductor switch 40 and the corresponding fourth conducting terminal 410 of the second diode 41. When the second sub-module 4 is placed on the first sub-module 3, the seventh electrode 420 is contacted with the upper sixth electrode 325, the eighth electrode 421 is contacted with the upper lower fifth electrode 324, and the ninth electrode 422 is contacted with the first electrode 320.

The ninth electrode 422 is arranged between the seventh electrode 420 and the eighth electrode 421. Moreover, a fixing material 38 is disposed on the auxiliary electrode 201. When the second sub-module 4 is placed on the first sub-module 3, the second sub-module 4 can be attached on the first sub-module 3 through the fixing material 38.

An example of the second semiconductor switch 40 includes but is not limited to an insulated-gate bipolar transistor (IGBT). Consequently, the second semiconductor switch 40 comprises three third conducting terminals 400. The three third conducting terminals 400 serve as a gate, an emitter and a collector, respectively. The seventh electrode 420 is electrically connected with the emitter. The eighth electrode 421 is electrically connected with the gate. The ninth electrode 422 is electrically connected with the collector.

Figure 4:
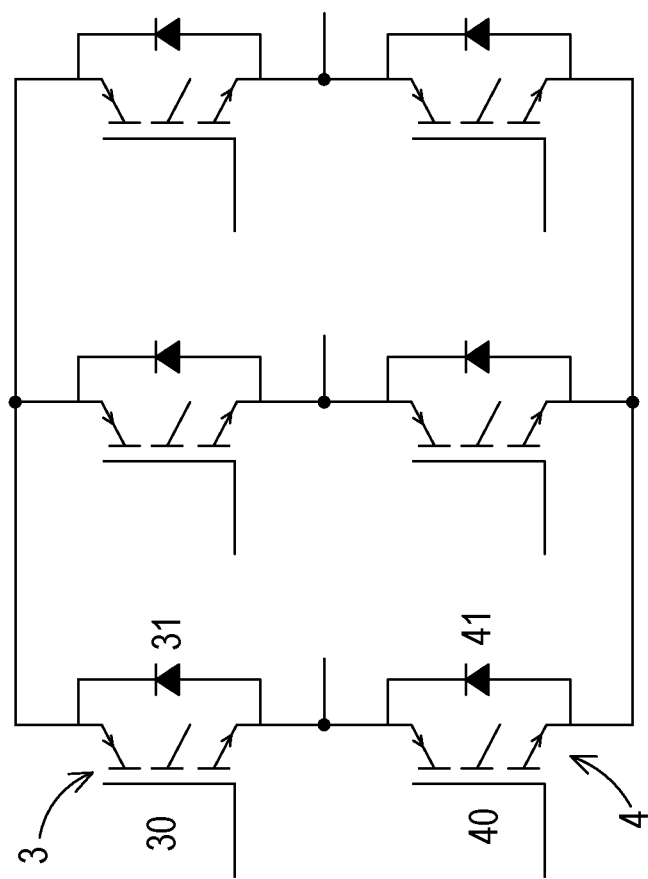
FIG. 4 is a schematic circuit diagram illustrating a three-phase bridge circuit of a three-phase power converter with the power module of FIG. 1.

FIG. 4 is a schematic circuit diagram illustrating a three-phase bridge circuit of a three-phase power converter with the power module of FIG. 1. In case that the power module 1 is applied to the three-phase power converter, the power module 1 comprises three first sub-modules 3 and three second sub-modules 4. Each first sub-module 3 and the corresponding second sub-module 4 are collaboratively formed as one leg of the three-phase bridge circuit. Moreover, the first sub-module 3 is formed as a high-voltage-side switching element, and the second sub-module 4 is formed as a low-voltage-side switching element. In each leg of the bridge circuit, the emitter of the high-voltage-side switching element is electrically connected with the collector of the low-voltage-side switching element. Moreover, as mentioned above, the first electrode 320 of the first sub-module 3 and the ninth electrode 422 of the second sub-module 4 are contacted with each other, the first electrode 320 is electrically connected with the emitter of the first semiconductor switch 30, and the ninth electrode 422 is electrically connected with the collector of the second semiconductor switch 40. In other words, the emitter of the high-voltage-side switching element (i.e. the first sub-module 3) is electrically connected with the collector of the low-voltage-side switching element (i.e. the second sub-module 4).

Please refer to FIGS. 2 and 3 again. The first sub-module 3 comprises the first semiconductor switch 30, the first diode 31, a first conductive layer 32, a first insulation layer 33, a second conductive layer 34, a first thermal conduction structure 97, a second thermal conduction structure 98, a third thermal conduction structure 99 and a fourth thermal conduction structure 100.

Moreover, plural first conductive vias 330 and plural second conductive vias 331 are formed in the first insulation layer 33. The first conductive layer 32 is formed on a bottom surface 332 of the first insulation layer 33 by an electroplating process. Moreover, the bottom surface 332 of the first insulation layer 33 is partially covered by the first conductive layer 32. The first conductive layer 32 is divided into the second electrode 321, the third electrode 322, the fourth electrode 323, the lower fifth electrode 324 and the lower sixth electrode 325 by an etching process.

The second conductive layer 34 is disposed on a top surface 333 of the first insulation layer 33 by an electroplating process. The second conductive layer 34 is divided into the first electrode 320, the upper fifth electrodes 324, the upper sixth electrodes 325 and the auxiliary electrode 201 by an etching process. The first electrode 320 and the auxiliary electrode 201 are contacted with the first ends of the corresponding first conductive vias 330. The first electrode 320 and the auxiliary electrode 201 are also contacted with the first ends of the corresponding second conductive vias 331. The upper fifth electrodes 324 and the upper sixth electrodes 325 are also contacted with the first ends of the corresponding second conductive vias 331.

The first semiconductor switch 30 is embedded within the first insulation layer 33. The first conducting terminals 300 serving as the gate of the first semiconductor switch 30 and the first conducting terminals 300 serving as the emitter of the first semiconductor switch 30 are disposed on a top surface 301 of the first semiconductor switch 30. The first conducting terminal 300 serving as the collector of the first semiconductor switch 30 is disposed on a bottom surface 302 of the first semiconductor switch 30. Moreover, the gate of the first semiconductor switch 30 is contacted with the second end of the corresponding first conductive via 330 so as to be electrically connected with the auxiliary electrode 201. The emitter of the first semiconductor switch 30 is contacted with the second ends of the corresponding first conductive vias 330 so as to be electrically connected with the first electrode 320. The collector of the first semiconductor switch 30 is contacted with the third electrode 322.

Similarly, the first diode 31 is embedded within the first insulation layer 33. The second conducting terminal 310 on a top surface 311 of the first diode 31 serves as an anode. Moreover, the anode of the first diode 31 is contacted with the second ends of the corresponding first conductive vias 330 so as to be electrically connected with the first electrode 320. The second conducting terminal 310 on a bottom surface 312 of the first diode 31 serves as a cathode. Moreover, the cathode of the first diode 31 is disposed on and electrically connected with the third electrode 322.

The first thermal conduction structure 97, the second thermal conduction structure 98, the third thermal conduction structure 99 and the fourth thermal conduction structure 100 are made of metallic material. Moreover, the four thermal conduction structures 97, 98, 99 and 100 may be implemented with the same lead frame or two different lead frames. These four thermal conduction structures 97, 98, 99 and 100 are embedded within the first insulation layer 33.

The first thermal conduction structure 97 is located near the first semiconductor switch 30, contacted with the second electrode 321, and contacted with the second ends of the corresponding second conductive vias 331 so as to be electrically connected with the auxiliary electrode 201. Moreover, the first thermal conduction structure 97 is partially exposed outside the first insulation layer 33. Consequently, the heat generated by the first semiconductor switch 30 may be transferred to the surroundings of the first sub-module 3 through the first thermal conduction structure 97. Moreover, the first conducting terminal 300 serving as the gate of the first semiconductor switch 30 is electrically connected with the second electrode 321 through the corresponding first conductive via 330, the auxiliary electrode 201, the corresponding second conductive vias 331 and the first thermal conduction structure 97. The second thermal conduction structure 98 is located near the first diode 31, contacted with the fourth electrode 323, and contacted with the second ends of the corresponding second conductive vias 331 so as to be electrically connected with the first electrode 320. Moreover, the second thermal conduction structure 98 is partially exposed outside the first insulation layer 33. Consequently, the heat generated by the first diode 31 may be transferred to the surroundings of the first sub-module 3 through the second thermal conduction structure 98. Moreover, the second conducting terminal 310 serving as the anode of the first diode 31 is electrically connected with the fourth electrode 323 through the corresponding first conductive vias 330, the first electrode 320, the corresponding second conductive vias 331 and the second thermal conduction structure 98.

The third thermal conduction structure 99 is located near the first thermal conduction structure 97, contacted with the lower fifth electrode 324, and contacted with the second ends of the corresponding second conductive vias 331 so as to be electrically connected with the upper fifth electrode 324. Moreover, the third thermal conduction structure 99 is partially exposed outside the first insulation layer 33. Consequently, a portion of the heat generated by the first semiconductor switch 30 may be transferred from the first thermal conduction structure 97 to the third thermal conduction structure 99 and further transferred to surroundings of the first sub-module 3. The fourth thermal conduction structure 100 is located near the second thermal conduction structure 98, contacted with the lower sixth electrode 325, and contacted with the second ends of the corresponding second conductive vias 331 so as to be electrically connected with the upper sixth electrode 325. Moreover, the fourth thermal conduction structure 100 is partially exposed outside the first insulation layer 33. Consequently, a portion of the heat generated by the first diode 31 may be transferred from the second thermal conduction structure 98 to the fourth thermal conduction structure 100 and further transferred to the surroundings of the first sub-module 3.

The second sub-module 4 comprises the second semiconductor switch 40, the second diode 41, a third conductive layer 42, a second insulation layer 43, a fourth conductive layer 44, a third insulation layer 45, a fifth conductive layer 46, a fifth thermal conduction structure 101 and a sixth thermal conduction structure 102.

Moreover, plural third conductive vias 430 and plural fourth conductive vias 431 are formed in the second insulation layer 43. The third conductive layer 42 is formed on a bottom surface 432 of the second insulation layer 43 by an electroplating process. Moreover, the bottom surface 432 of the second insulation layer 43 is partially covered by the third conductive layer 42. The third conductive layer 42 is divided into the seventh electrode 420, the eighth electrode 421 and the ninth electrode 422 by an etching process. The locations of the seventh electrode 420, the eighth electrode 421 and the ninth electrode 422 correspond to the locations of the upper sixth electrode 325, the upper lower fifth electrode 324 and the first electrode 320, respectively.

The fourth conductive layer 44 is formed on a top surface 433 of the second insulation layer 43 by an electroplating process. Moreover, by an etching process, the fourth conductive layer 44 is divided into a first conductive block 423 and a second conductive block 424. The first conductive block 423 is contacted with the first ends of the corresponding third conductive vias 430 and the first ends of the corresponding fourth conductive vias 431. The second conductive block 424 is contacted with the first end of the corresponding third conductive via 430 and the first ends of the corresponding fourth conductive vias 431. The third insulation layer 45 is disposed on the fourth conductive layer 44. The fifth conductive layer 46 is electroplated on the third insulation layer 45.

The second semiconductor switch 40 is embedded within the second insulation layer 43. The third conducting terminals 400 serving as the gate and the emitter of the second semiconductor switch 40 are disposed on a top surface 402 of the second semiconductor switch 40. The third conducting terminal 400 serving as the collector is disposed on a bottom surface 401 of the second semiconductor switch 40. The gate of the second semiconductor switch 40 is contacted with the second end of the corresponding third conductive via 430 so as to be electrically connected with the second conductive block 424. The emitter of the second semiconductor switch 40 is contacted with the second ends of the corresponding third conductive vias 430 so as to be electrically connected with the first conductive block 423. The collector of the second semiconductor switch 40 is contacted with the ninth electrode 422.

Similarly, the second diode 41 is embedded within the second insulation layer 43. The fourth conducting terminal 410 on a bottom surface 411 of the second diode 41 serves as a cathode. Moreover, the cathode of the second diode 41 is contacted with the ninth electrode 422. The fourth conducting terminal 410 on a top surface 412 of the second diode 41 serves as an anode. Moreover, the anode of the second diode 41 is contacted with the second ends of the corresponding third conductive vias 430 so as to be electrically connected with the first conductive block 423.

The fifth thermal conduction structure 101 and the sixth thermal conduction structure 102 are embedded within the second insulation layer 43. The fifth thermal conduction structure 101 and the sixth thermal conduction structure 102 are made of metallic material. Moreover, the fifth thermal conduction structure 101 and the sixth thermal conduction structure 102 may be implemented with the same lead frame or two different lead frames.

The fifth thermal conduction structure 101 is located near the second semiconductor switch 40, contacted with the eighth electrode 421, and contacted with the second ends of the corresponding fourth conductive vias 431 so as to be electrically connected with the second conductive block 424. Moreover, the fifth thermal conduction structure 101 is partially exposed outside the second insulation layer 43. Consequently, the heat generated by the second semiconductor switch 40 may be transferred to the surroundings of the second first sub-module 4 through the fifth thermal conduction structure 101. Moreover, the third conducting terminal 400 serving as the gate of the second semiconductor switch 40 is electrically connected with the eighth electrode 421 through the corresponding third conductive via 430, the second conductive block 424, the corresponding fourth conductive vias 431 and the fifth thermal conduction structure 101. The sixth thermal conduction structure 102 is located near the second diode 41, contacted with the seventh electrode 420, and contacted with the second ends of the corresponding fourth conductive vias 431 so as to be electrically connected with the first conductive block 423. Moreover, the sixth thermal conduction structure 102 is partially exposed outside the second insulation layer 43. Consequently, the heat generated by the second diode 41 may be transferred to the surroundings of the second first sub-module 4 through the sixth thermal conduction structure 102. Moreover, the fourth conducting terminal 410 serving as the anode of the second diode 41 is electrically connected with the seventh electrode 420 through the corresponding third conductive vias 430, the first conductive block 423, the corresponding fourth conductive vias 431 and the sixth thermal conduction structure 102.

When the second sub-module 4 is placed on the first sub-module 3, the third conducting terminal 400 serving as the gate of the second semiconductor switch 40 is electrically connected with the corresponding first conducting part 20 of the substrate 2 through the corresponding third conductive via 430, the second conductive block 424, the corresponding fourth conductive vias 431, the fifth thermal conduction structure 101, the eighth electrode 421, the upper fifth electrode 324, the corresponding second conductive vias 331, the third thermal conduction structure 99 and the lower fifth electrode 324. Moreover, the third conducting terminal 400 serving as the emitter of the second semiconductor switch 40 is electrically connected with the corresponding second conducting part 21 of the substrate 2 through the corresponding third conductive vias 430, the first conductive block 423, the corresponding fourth conductive vias 431, the sixth thermal conduction structure 102, the seventh electrode 420, the upper sixth electrode 325, the corresponding second conductive vias 331, the fourth thermal conduction structure 100 and the lower sixth electrode 325.

In an embodiment, the first insulation layer 33 and the second insulation layer 43 are made of resin, Ajinomoto build-up film (ABF), prepreg material, molding compound, epoxy material, epoxy with filler or any other appropriate insulation material with high thermal conductivity. The first conductive layer 32, the second conductive layer 34, the third conductive layer 42, the fourth conductive layer 44 and the fifth conductive layer 46 are made of electrically conductive material (e.g. copper). The third insulation layer 45 is made of insulation material with high thermal conductivity (e.g. ceramic material).

From the above descriptions, the first semiconductor switch 30 and the first diode 31 are embedded within the first insulation layer 33 and packaged as the first sub-module 3, and the second semiconductor switch 40 and the second diode 41 are embedded within the third insulation layer 43 and packaged as the second sub-module 4. Moreover, the first sub-module 3 is formed as the high-voltage-side switching element, and the second sub-module 4 is formed as the low-voltage-side switching element. The plural first conducting terminals 300 of the first semiconductor switch 30 and the plural second conducting terminals 310 of the first diode 31 are electrically contacted with the corresponding electrodes of the first electrode 320, the second electrode 321 and the third electrode 322 of the first sub-module 3. The plural third conducting terminals 400 of the second semiconductor switch 40 and the plural fourth conducting terminals 410 of the second diode 41 are electrically contacted with the corresponding electrodes of the seventh electrode 420, the eighth electrode 421 and the ninth electrode 422 of the second sub-module 4. When the first sub-module 3 is disposed on the substrate 2 and the second sub-module 4 is disposed on the first sub-module 3, the second electrode 321, the third electrode 322, the fourth electrode 323, the lower fifth electrode 324 and the lower sixth electrode 325 of the first sub-module 3 are contacted with corresponding conducting parts of the first conducting parts 20, the second conducting parts 21 and the third conducting part 22 of the substrate 2. Consequently, the first sub-module 3 may be electrically connected with other electronic components. Moreover, the seventh electrode 420, the eighth electrode 421 and the ninth electrode 422 of the second sub-module 4 are electrically connected with the corresponding second conducting part 21, the corresponding first conducting part 20 and the third conducting part 22 of the substrate 2 through the upper sixth electrode 325, the first electrode 320 and the upper fifth electrode 324. Consequently, the second sub-module 4 may be electrically connected with other electronic components. In comparison with the conventional method of connecting the high-voltage-side switching element and the low-voltage-side switching element of the conventional bridge circuit by the wire-bonded technology, the power module 1 of the present invention has reduced parasitic inductance, increased switching efficiency, reduced impedance and increased power conversion efficiency. Moreover, since it is not necessary to retain a wire-bonded area on the substrate 2, the space utilization of the substrate is increased. Under this circumstance, the power density is enhanced. Moreover, since the first sub-module 3 and the second sub-module 4 are independently formed as the high-voltage-side switching elements and the low-voltage-side switching element, if the first sub-module 3 or the second sub-module 4 has malfunction, the damaged sub-module may be replaced with a new one. After the damaged sub-module is replaced, the first sub-module 3 and the second sub-module 4 can be normally operated. Moreover, since the second sub-module 4 and the first sub-module 3 are located at different levels, the connection distance between the high-voltage-side switching element and the low-voltage-side switching element is effectively shortened. Under this circumstance, the on-resistance is effectively reduced, the parasitic effect is reduced, the electrical property is enhanced, and the overall power density of the power module 1 is increased.

Figure 5:
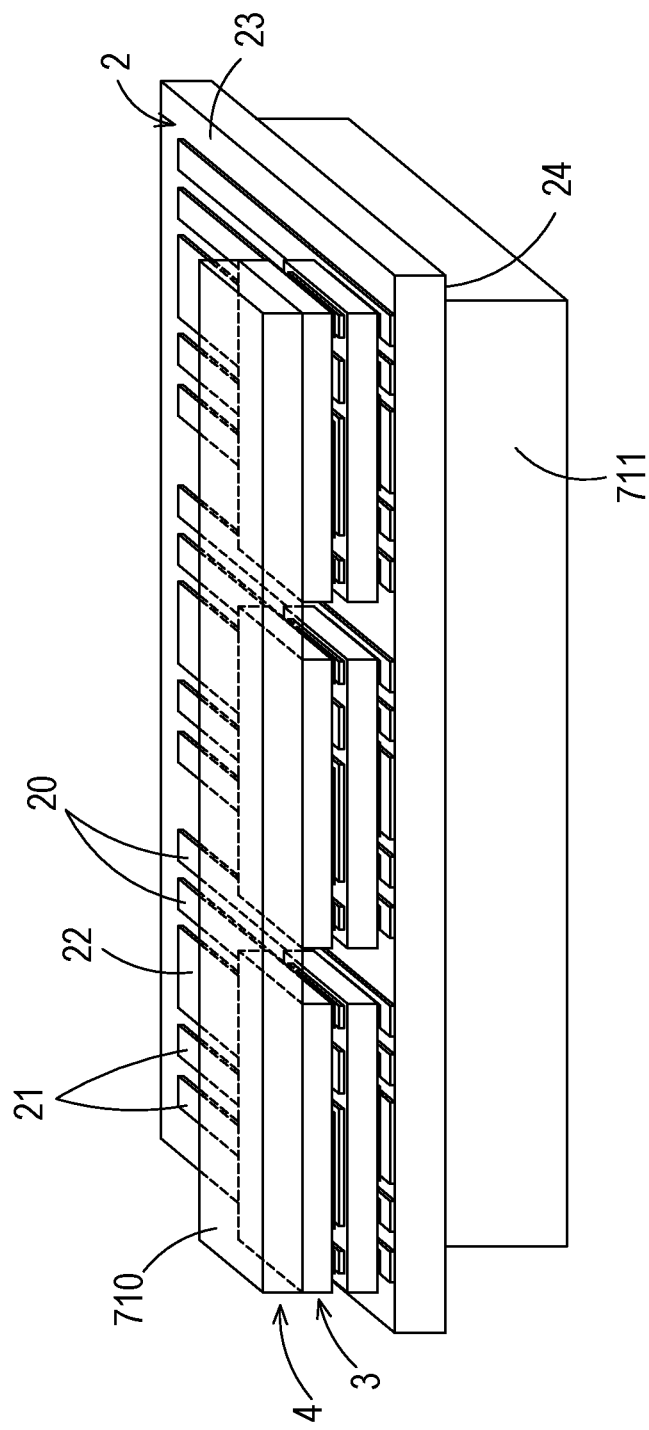
FIG. 5 is a schematic perspective view illustrating a power module according to another embodiment of the present invention.

FIG. 5 is a schematic perspective view illustrating a power module according to another embodiment of the present invention. In comparison with the power module 1 of FIG. 1, the power module 7 of this embodiment further comprises a first heat dissipation device 710 and a second heat dissipation device 711. The first heat dissipation device 710 is disposed on the top surface of the second sub-module 4 and contacted with the second sub-module 4. That is, the first heat dissipation device 710 is contacted with the fifth conductive layer 46 of the second sub-module 4. Consequently, the heat dissipating efficacy of the first sub-module 3 and the second sub-module 4 will be enhanced. The second heat dissipation device 711 is disposed on a second surface 24 of the substrate 2, which is opposed to the first surface 23 of the substrate 2. Consequently, the heat dissipating efficacy of the power module 7 will be further enhanced.

In an embodiment, each of the first heat dissipation device 710 and the second heat dissipation device 711 may be a passive heat dissipation device or an active heat dissipation device. An example of the passive heat dissipation device includes but is not limited to a heat sink, which is made of metallic material or ceramic material. An example of the active heat dissipation device includes but is not limited to cooling water or heat pipe.

From the above descriptions, the present invention provides the power module. The first semiconductor switch and the first diode are embedded within the first insulation layer. The second semiconductor switch and the second diode are embedded within the third insulation layer. Moreover, the first sub-module is formed as the high-voltage-side switching element, and the second sub-module is formed as the low-voltage-side switching element. The plural first conducting terminals of the first semiconductor switch and the plural second conducting terminals of the first diode are electrically contacted with the corresponding electrodes of the first electrode, the second electrode and the third electrode of the first sub-module. The plural third conducting terminals of the second semiconductor switch and the plural fourth conducting terminals of the second diode are electrically contacted with the corresponding electrodes of the seventh electrode, the eighth electrode and the ninth electrode of the second sub-module. When the first sub-module is disposed on the substrate and the second sub-module is disposed on the first sub-module, the second electrode, the third electrode, the fourth electrode, the lower fifth electrode and the lower sixth electrode of the first sub-module are contacted with corresponding conducting parts of the first conducting parts, the second conducting parts and the third conducting part of the substrate. Consequently, the first sub-module may be electrically connected with other electronic components. Moreover, the seventh electrode, the eighth electrode and the ninth electrode of the second sub-module are electrically connected with the corresponding second conducting part, the corresponding first conducting part and the third conducting part of the substrate through the upper sixth electrode, the first electrode and the upper fifth electrode. Consequently, the second sub-module may be electrically connected with other electronic components. In comparison with the conventional method of connecting the high-voltage-side switching element and the low-voltage-side switching element of the conventional bridge circuit by the wire-bonded technology, the power module of the present invention has reduced parasitic inductance, increased switching efficiency, reduced impedance and increased power conversion efficiency. Moreover, since it is not necessary to retain a wire-bonded area on the substrate, the space utilization of the substrate is increased. Under this circumstance, the power density is enhanced. Moreover, since the first sub-module and the second sub-module are independently formed as the high-voltage-side switching elements and the low-voltage-side switching element, if the first sub-module or the second sub-module has malfunction, the damaged sub-module may be replaced with a new one. After the damaged sub-module is replaced, the first sub-module and the second sub-module can be normally operated. Moreover, since the second sub-module and the first sub-module are located at different levels, the connection distance between the high-voltage-side switching element and the low-voltage-side switching element is effectively shortened. Under this circumstance, the on-resistance is effectively reduced, the parasitic effect is reduced, the electrical property is enhanced, and the overall power density of the power module is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
a substrate comprising plural first conducting parts, plural second conducting parts and at least one third conducting part;
at least one first sub-module disposed on the substrate, wherein the first sub-module comprises a first semiconductor switch, a first diode, a first electrode, a second electrode, a third electrode, a fourth electrode, an upper fifth electrode, a lower fifth electrode, an upper sixth electrodes and a lower sixth electrode, wherein the upper fifth electrode and the lower fifth electrode are electrically connected with each other, and the upper sixth electrodes and the lower sixth electrode are electrically connected with each other, wherein the first electrode, the upper fifth electrode and the upper sixth electrode are located at a top side of the first sub-module, and the second electrode, the third electrode, the fourth electrode, the lower fifth electrode and the lower sixth electrode are located at a bottom side of the first sub-module, wherein the first semiconductor switch comprises plural first conducting terminals, and the first diode comprises plural second conducting terminals, wherein the first electrode and the third electrode are electrically connected with the corresponding first conducting terminals of the first semiconductor switch and electrically connected with the corresponding second conducting terminals of the first diode, the first electrode is electrically connected with the fourth electrode, the second electrode is electrically connected with the corresponding first conducting terminal of the first semiconductor switch, the second electrode and the lower fifth electrode are electrically connected with the corresponding first conducting parts, the fourth electrode and the lower sixth electrode are electrically connected with the corresponding second conducting parts, and the third electrode is electrically connected with the third conducting part; and
at least one second sub-module disposed on the first sub-module, wherein the second sub-module comprises a second semiconductor switch, a second diode, a seventh electrode, an eighth electrode and a ninth electrode, wherein the second semiconductor switch comprises plural third conducting terminals, and the second diode comprises plural fourth conducting terminals, wherein the seventh electrode is electrically connected with the corresponding third conducting terminal of the second semiconductor switch and the corresponding fourth conducting terminal of the second diode, the eighth electrode is electrically connected with the corresponding third conducting terminal of the second semiconductor switch, and the ninth electrode is electrically connected with the corresponding third conducting terminal of the second semiconductor switch and the corresponding fourth conducting terminal of the second diode, wherein the seventh electrode is electrically connected with the upper sixth electrode of the first sub-module, the eighth electrode is electrically connected with the upper fifth electrode of the first sub-module, and the ninth electrode is electrically connected with the first electrode of the first sub-module;
wherein the first sub-module and the second sub-module are formed as a high-voltage-side switching element and a low-voltage-side switching element of a bridge circuit, respectively.

2. The power module according to claim 1, wherein the first semiconductor switch is an insulated-gate bipolar transistor, and the first semiconductor switch comprises three first conducting terminals, wherein the three first conducting terminals serve as a gate, an emitter and a collector, respectively, wherein the first electrode is electrically connected with the emitter of the first semiconductor switch, the second electrode is electrically connected with the gate of the first semiconductor switch, and the third electrode is electrically connected with the collector of the first semiconductor switch.

3. The power module according to claim 2, wherein the first sub-module further comprises an auxiliary electrode, wherein the auxiliary electrode is located at the top side of the first sub-module, and arranged between the first electrode and the upper fifth electrode.

4. The power module according to claim 3, wherein the first sub-module further comprises a fixing material, wherein the fixing material is disposed on the auxiliary electrode, and the second sub-module is attached on the first sub-module through the fixing material.

5. The power module according to claim 3, wherein the first sub-module further comprises:
   a first insulation layer, wherein plural first conductive vias and plural second conductive vias are formed in the first insulation layer;
   a first conductive layer electroplated on a bottom surface of the first insulation layer, and divided into the second electrode, the third electrode, the fourth electrode, the lower fifth electrode and the lower sixth electrode; and
   a second conductive layer electroplated on a top surface of the first insulation layer, and divided into the first electrode, the upper fifth electrodes, the upper sixth electrodes and the auxiliary electrode, wherein the first electrode and the auxiliary electrode are contacted with a first end of the corresponding first conductive via and a first end of the corresponding second conductive via, and the upper fifth electrodes and the upper sixth electrodes are contacted with the first end of the corresponding second conductive via.

6. The power module according to claim 5, wherein the first semiconductor switch and the first diode are embedded within the first insulation layer, wherein the first conducting terminal serving as the gate of the first semiconductor switch is contacted with a second end of the corresponding first conductive via so as to be electrically connected with the auxiliary electrode, the first conducting terminal serving as the emitter of the first semiconductor switch is contacted with the second end of the corresponding first conductive vias so as to be electrically connected with the first electrode, and the first conducting terminal serving as the collector of the first semiconductor switch is electrically connected with the third electrode, wherein the second conducting terminal serving as an anode of the first diode is contacted with the second end of the corresponding first conductive vias so as to be electrically connected with the first electrode, and the second conducting terminal serving as a cathode of the first diode is electrically connected with the third electrode.

7. The power module according to claim 5, wherein the first sub-module further comprises:
   a first thermal conduction structure embedded within the first insulation layer, wherein the first thermal conduction structure is located near the first semiconductor switch and partially exposed outside the first insulation layer, so that the heat generated by the first semiconductor switch is transferred to the surroundings of the first sub-module through the first thermal conduction structure;
   a second thermal conduction structure embedded within the first insulation layer, wherein the second thermal conduction structure is located near the first diode and partially exposed outside the first insulation layer, so that the heat generated by the first diode is transferred to the surroundings of the first sub-module through the second thermal conduction structure;
   a third thermal conduction structure embedded within the first insulation layer, wherein the third thermal conduction structure is located near the first thermal conduction structure and partially exposed outside the first insulation layer; and
   a fourth thermal conduction structure embedded within the first insulation layer, wherein the fourth thermal conduction structure is located near the second thermal conduction structure and partially exposed outside the first insulation layer.

8. The power module according to claim 7, wherein the first thermal conduction structure, the second thermal conduction structure, the third thermal conduction structure and the fourth thermal conduction structure are made of metallic material, wherein the first thermal conduction structure is contacted with the second electrode and contacted with a second end of the corresponding second conductive via so as to be electrically connected with the auxiliary electrode, the second thermal conduction structure is contacted with the fourth electrode and contacted with the second end of the corresponding second conductive via so as to be electrically connected with the first electrode, the third thermal conduction structure is contacted with the lower fifth electrode and contacted with the second end of the corresponding second conductive via so as to be electrically connected with the upper fifth electrode, and the fourth thermal conduction structure is contacted with the lower sixth electrode and contacted with the second end of the corresponding second conductive via so as to be electrically connected with the upper sixth electrode.

9. The power module according to claim 1, wherein the second semiconductor switch is an insulated-gate bipolar transistor, and the second semiconductor switch comprises three third conducting terminals, wherein the three third conducting terminals serve as a gate, an emitter and a collector, respectively, wherein the seventh electrode is electrically connected with the emitter of the second semiconductor switch, the eighth electrode is electrically connected with the gate of the second semiconductor switch, and the ninth electrode is electrically connected with the collector of the second semiconductor switch.

10. The power module according to claim 9, wherein the second sub-module further comprises:
   a second insulation layer, wherein plural third conductive vias and plural fourth conductive vias are formed in the second insulation layer;
   a third conductive layer electroplated on a bottom surface of the second insulation layer, and divided into the seventh electrode, the eighth electrode and the ninth electrode;
   a fourth conductive layer electroplated on a top surface of the second insulation layer, and divided into a first conductive block and a second conductive block, wherein the first conductive block and the second conductive block are contacted with a first end of the corresponding third conductive via and a first end of the corresponding fourth conductive via;
   a third insulation layer disposed on the fourth conductive layer; and
   a fifth conductive layer electroplated on the third insulation layer.

11. The power module according to claim 10, wherein the second semiconductor switch and the second diode are embedded within the second insulation layer, wherein the third conducting terminal serving as the gate of the second semiconductor switch is contacted with a second end of the corresponding third conductive via so as to be electrically connected with the second conductive block, the third conducting terminal serving as the emitter of the second semiconductor switch is contacted with the second end of the corresponding third conductive via so as to be electrically connected with the first conductive block, and the third conducting terminal serving as the collector of the second semiconductor switch is disposed on and contacted with the ninth electrode, wherein the fourth conducting terminal serving as an anode of the second diode is contacted with the second end of the corresponding third conductive via so as to be electrically connected with the first conductive block, and the fourth conducting terminal serving as a cathode of the second diode is disposed on and contacted with the ninth electrode.

12. The power module according to claim 10, wherein the second sub-module further comprises:
a fifth thermal conduction structure embedded within the second insulation layer, wherein the fifth thermal conduction structure is located near the second semiconductor switch and partially exposed outside the second insulation layer, so that the heat generated by the second semiconductor switch is transferred to the surroundings of the second sub-module through the fifth thermal conduction structure; and
a sixth thermal conduction structure embedded within the second insulation layer, wherein the sixth thermal conduction structure is located near the second diode and partially exposed outside the second insulation layer, so that the heat generated by the second diode is transferred to the surroundings of the second sub-module through the sixth thermal conduction structure.

13. The power module according to claim 12, wherein the fifth thermal conduction structure and the sixth thermal conduction structure are made of metallic material, wherein the fifth thermal conduction structure is contacted with the eighth electrode and contacted with a second end of the corresponding fourth conductive via so as to be electrically connected with the second conductive block, and the sixth thermal conduction structure is contacted with the seventh electrode and contacted with the second end of the corresponding fourth conductive via so as to be electrically connected with the first conductive block.

14. The power module according to claim 1, further comprising a first heat dissipation device and/or a second heat dissipation device, wherein the first heat dissipation device is contacted with the second sub-module, and the second heat dissipation device is contacted with the substrate.

* * * * *